United States Patent
Watanabe

(10) Patent No.: US 8,807,707 B2
(45) Date of Patent: Aug. 19, 2014

(54) LIQUID JET HEAD AND LIQUID JET APPARATUS

(71) Applicant: Toshiaki Watanabe, Chiba (JP)

(72) Inventor: Toshiaki Watanabe, Chiba (JP)

(73) Assignee: SII Printek Inc. (JP)

( * ) Notice: Subject to any disclaimer, the term of this patent is extended or adjusted under 35 U.S.C. 154(b) by 0 days.

(21) Appl. No.: 13/625,925

(22) Filed: Sep. 25, 2012

(65) Prior Publication Data

US 2013/0083128 A1    Apr. 4, 2013

(30) Foreign Application Priority Data

Sep. 27, 2011   (JP) ................................ 2011-211217

(51) Int. Cl.
  B41J 2/14      (2006.01)
  H05K 1/14      (2006.01)
(52) U.S. Cl.
  CPC .................................. *H05K 1/147* (2013.01)
  USPC ......................................................... 347/50
(58) Field of Classification Search
  CPC ..................... B41J 2002/14491; H05K 1/147
  USPC ......................................................... 347/50
  See application file for complete search history.

(56) References Cited

U.S. PATENT DOCUMENTS

| 4,972,205 A * | 11/1990 | Nagato .......................... 347/200 |
| 2006/0044355 A1* | 3/2006 | Ito ................................... 347/59 |
| 2007/0182790 A1* | 8/2007 | Ito ................................... 347/71 |
| 2009/0213182 A1* | 8/2009 | Yamanaka ....................... 347/50 |

FOREIGN PATENT DOCUMENTS

| JP | 10146974 | 6/1998 |
| JP | 2004209796 | 7/2004 |

* cited by examiner

*Primary Examiner* — Stephen Meier
*Assistant Examiner* — Alexander D Shenderov
(74) *Attorney, Agent, or Firm* — Adams & Wilks

(57) ABSTRACT

Provided is a liquid jet head in which a region of the liquid jet head on a side opposite to a liquid ejection side thereof is thinned to enhance efficiency of use of the region. A liquid jet head (1) includes an ejecting portion (3) for ejecting liquid in which first and second head chips (2a and 2b) are stacked, a circuit board (4) for supplying a drive signal for driving the ejecting portion (3), a first flexible printed circuit board (5a) for electrically connecting the first head chip (2a) and the circuit board (4) to each other, and a second flexible printed circuit board (5b) for electrically connecting the second head chip (2b) and the circuit board (4) to each other. The circuit board (4) and each of the first and second flexible printed circuit boards (5a and 5b) are electrically connected to each other on one surface (S) of the circuit board (4).

17 Claims, 4 Drawing Sheets

LIQUID JET HEAD AND LIQUID JET APPARATUS

BACKGROUND OF THE INVENTION

1. Field of the Invention

The present invention relates to a liquid jet head which ejects liquid from nozzles to form images and letters on a recording medium or to form a functional thin film, and a liquid jet apparatus using the same.

2. Description of the Related Art

In recent years, there has been used an ink jet type liquid jet head which ejects ink droplets onto recording paper and the like to draw letters and diagrams, or ejects a liquid material onto a surface of an element substrate to form a functional thin film. The liquid jet head of this type is supplied with ink or a liquid material (hereinafter, collectively referred to as liquid) from a liquid tank via a supply tube, and ejects the liquid filled in channels thereof from nozzles communicated to the channels. At the time of liquid ejection, the liquid jet head and a recording medium for recording the jetted liquid are moved, to thereby record the letters and diagrams or form the functional thin film in a predetermined shape.

FIG. 6 is a transverse sectional view of an ink jet head in which two head chips 101 are stacked (FIG. 12 of Japanese Patent Application Laid-open No. 2004-209796). By stacking the two head chips 101, the number of nozzles is doubled to enable high density recording. Each of the head chips 101 includes a channel portion 115 sandwiched between a lower substrate 111 and an upper substrate 113, a nozzle plate 102 adhered to a front surface of the channel portion 115, a wiring board 103 adhered to an outer surface of the lower substrate 111, and a driver IC 132 mounted on the wiring board 103. The channel portion 115 is surrounded by the lower substrate 111, the upper substrate 113, and two walls (not shown) formed of a piezoelectric body which are sandwiched between the lower substrate 111 and the upper substrate 113.

The two head chips 101 are stacked under a state in which the upper substrates 113 thereof face each other and the lower substrates 111 thereof are on outer sides. The wiring board 103 is adhered to the outer surface of each of the two lower substrates 111. In other words, the two head chips 101 are sandwiched by the two wiring boards 103. The driver IC 132 is mounted on an inner surface of each of the wiring boards 103. Therefore, regions of the two head chips 101 opposite to a liquid ejection side are surrounded by the two wiring boards 103.

A control signal is input to the driver IC 132 mounted on the wiring board 103 from an external circuit such as a control circuit via a connector 133 and a wiring 134, and the driver IC 132 generates a drive signal for selectively driving each of the channel portions 115. The drive signal generated by the driver IC 132 is supplied via a driver wiring 131 to the channel portion 115. The two walls formed of the piezoelectric body deform in accordance with the drive signal to change the capacity of the channel portion 115. This causes liquid filled in the channel portion 115 to be ejected from nozzles.

Japanese Patent Application Laid-open No. Hei 10-146974 describes an ink jet head in which many actuator units having the same structure are stacked. One actuator unit includes a base plate having a plurality of groove-like ink chambers formed therein and a cover plate which is adhered to an upper surface of the base plate and which covers the plurality of ink chambers. The cover plate of an adjacent actuator unit is adhered to a bottom surface of the base plate. A nozzle plate is adhered to a front surface of the plurality of stacked actuator units in an ink ejection direction. Nozzles are formed in the nozzle plate at locations corresponding to the grooves in the base plate. The cover plate located between base plates has a projected portion protruding in a rear surface direction on a side opposite to the nozzle plate. A driver IC chip is mounted on the projected portion, and a flexible printed circuit board (also referred to as FPC) is connected to an end portion of the projected portion. Therefore, a region of the actuator unit opposite to the nozzle plate side is occupied by the projected portions of the plurality of cover plates and the FPC connected to the projected portions.

FIG. 7 is a schematic perspective view of a liquid jet head 200 including a two-row head chip 201 having two nozzle rows formed by bonding two actuator substrates 202 and 203 formed of a piezoelectric body. The liquid jet head 200 includes the two-row head chip 201, two circuit boards 204 and 205 for supplying a drive signal to the two-row head chip 201, a relay printed circuit board 212 for supplying a control signal to the two circuit boards 204 and 205, two flexible printed circuit boards 206 and 207 for electrically connecting the two circuit boards 204 and 205 and the two-row head chip 201, and two flexible printed circuit boards 208 and 209 for electrically connecting the relay printed circuit board 212 and the two circuit boards 204 and 205, respectively.

The relay printed circuit board 212 includes a connector 213 for connection to an external device for inputting a control signal from an external circuit, and supplies the input control signal via the two flexible printed circuit boards 208 and 209 to the two circuit boards 204 and 205, respectively. The two circuit boards 204 and 205 include driver ICs 210 and 211, respectively. Each of the driver ICs 210 and 211 generates a drive signal for driving the two-row head chip 201 based on the input control signal. The drive signal generated by the driver IC 210 is supplied via the flexible printed circuit board 206 to the upper actuator substrate 202, while the drive signal generated by the driver IC 211 is supplied via the flexible printed circuit board 207 to the lower actuator substrate 203.

Therefore, the liquid jet head 200 including the two-row head chip 201 requires the two circuit boards 204 and 205, the one relay printed circuit board 212, and the four flexible printed circuit boards 206, 207, 208, and 209.

In the ink jet head described in Japanese Patent Application Laid-open No. 2004-209796, the wiring boards 103 which greatly protrude on a side opposite to the liquid ejection side are located outside the lower substrates 111 forming the respective head chips 101. This increases the weight of the ink jet head, increases the mass of a carriage having a plurality of the ink jet heads mounted thereon, and causes a drive system for driving the carriage to be under a heavy load. Further, regions of the two head chips 101 on the side opposite to the liquid ejection side are occupied by the wiring boards 103, and these regions cannot be effectively used for other devices.

With regard to the ink jet head described in Japanese Patent Application Laid-open No. Hei 10-146974, similarly, the cover plate located between the base plates has the projected portion protruding on the side opposite to the liquid ejection side, and the projected portion is connected to the driver IC chip for driving and to an FPC for transmitting a signal from an external circuit to the driver IC chip. Therefore, the region opposite to the liquid ejection side is occupied by the projected portion and the FPC, and the region cannot be effectively used for other devices.

Further, in the conventionally known liquid jet head illustrated in FIG. 7, in addition to the two-row head chip 201, the four flexible printed circuit boards 206 to 209, the two circuit boards 204 and 205, and the relay one printed circuit board 212 are required. The number of parts is large, and the assembly process of assembling the parts is complicated and takes time. Further, similarly to the cases of Japanese Patent Application Laid-open Nos. 2004-209796 and Hei 10-146974, the two circuit boards, the four flexible printed circuit boards, and the one relay printed circuit board are located in the region opposite to the liquid ejection side. Therefore, there is a limit in forming the region so as to be thin.

SUMMARY OF THE INVENTION

The present invention has been made in view of the above-mentioned problem, and an object of the present invention is to provide a liquid jet head in which a region of the liquid jet head opposite to a liquid ejection side is thinned to reduce the weight.

According to an exemplary embodiment of the present invention, there is provided a liquid jet head, including: an ejecting portion for ejecting liquid in which a first head chip and a second head chip are stacked; a circuit board for supplying a drive signal for driving the ejecting portion; a first flexible printed circuit board for electrically connecting the first head chip and the circuit board; and a second flexible printed circuit board for electrically connecting the second head chip and the circuit board. The circuit board and each of the first flexible printed circuit board and the second flexible printed circuit board are electrically connected on one surface of the circuit board.

Further, the first flexible printed circuit board and the second flexible printed circuit board overlap so as to have one of a V-shape and a Y-shape when seen in plan view.

Still further, the first flexible printed circuit board and the second flexible printed circuit board do not overlap each other when seen from a direction of a normal to the one surface of the circuit board.

Yet further, the first head chip includes a first electrode extracting portion. The second head chip includes a second electrode extracting portion. The first electrode extracting portion and the second electrode extracting portion are arranged so that the first electrode extracting portion and the second electrode extracting portion overlap each other in a direction in which the first head chip and the second head chip are stacked.

Yet further, the circuit board includes a first electrode terminal portion and a second electrode terminal portion. The first electrode terminal portion and the second electrode terminal portion are arranged in a line along a longitudinal direction of the first electrode terminal portion and a longitudinal direction of the second electrode terminal portion on the one surface of the circuit board.

Yet further, the first flexible printed circuit board electrically connects the first electrode extracting portion and the first electrode terminal portion to each other. The second flexible printed circuit board electrically connects the second electrode extracting portion and the second electrode terminal portion to each other.

Yet further, the liquid jet head further includes a base substrate for fixing the ejecting portion and the circuit board. The circuit board includes a driver IC mounted on the one surface of the circuit board. The liquid jet head further includes a thermally conductive material interposed between the base substrate and another surface of the circuit board corresponding to a region on the one surface of the circuit board in which the driver IC is mounted.

Yet further, the driver IC is located on a first metal film formed on the one surface of the circuit board. The another surface of the circuit board corresponding to a region on the one surface of the circuit board in which the first metal film is located has a second metal film formed thereon. The first metal film and the second metal film are connected to each other via a metal material filled in a through hole formed in the circuit board.

According to an exemplary embodiment of the present invention, there is provided a liquid jet apparatus, including: the liquid jet head having any one of the above-mentioned configurations; a moving mechanism for reciprocating the liquid jet head; a liquid supply tube for supplying liquid to the liquid jet head; and a liquid tank for supplying the liquid to the liquid supply tube.

According to the present invention, the liquid jet head includes: the ejecting portion for ejecting liquid in which the first head chip and the second head chip are stacked; the circuit board for supplying the drive signal for driving the ejecting portion; the first flexible printed circuit board for electrically connecting the first head chip and the circuit board; and the second flexible printed circuit board for electrically connecting the second head chip and the circuit board. The circuit board and each of the first flexible printed circuit board and the second flexible printed circuit board are electrically connected on the one surface of the circuit board. With this structure, it is possible to thin a region occupied by the circuit board for supplying the drive signal for driving the ejecting portion and by the first and second flexible printed circuit boards. Further, the number of parts is reduced, and thus, the weight can be reduced. Still further, the number of assembly steps is reduced, and thus, manufacturing cost can be reduced.

DETAILED DESCRIPTION OF THE PREFERRED EMBODIMENTS (First Embodiment)

Figure 1A:
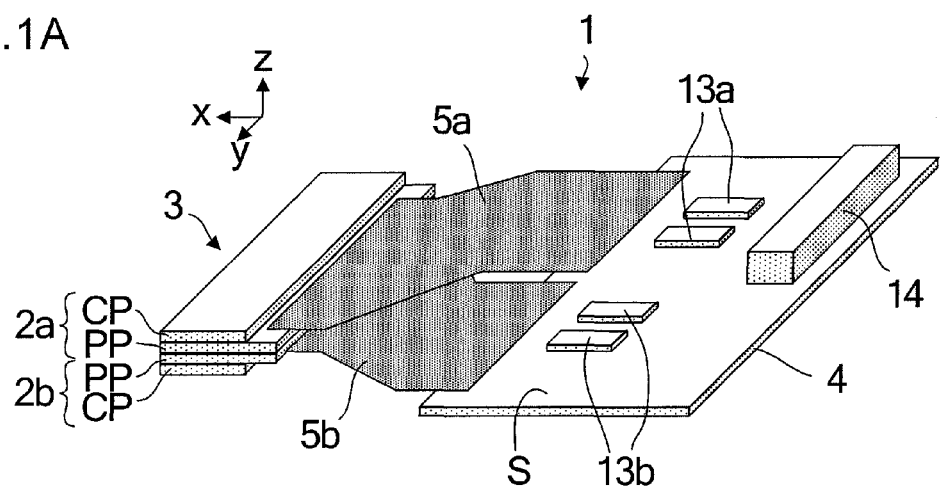
FIGS. 1A and 1B are explanatory diagrams of a liquid jet head according to a first embodiment of the present invention.
Figure 1B:
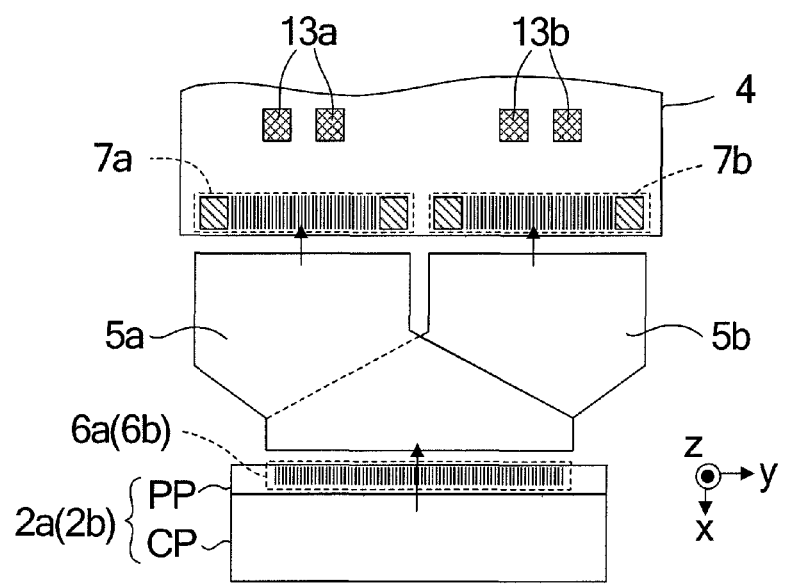

FIGS. 1A and 1B are explanatory diagrams of a liquid jet head 1 according to a first embodiment of the present invention. FIG. 1A is a schematic perspective view of the liquid jet head 1 and FIG. 1B is a plan view illustrating elements forming the liquid jet head 1.

As illustrated in FIGS. 1A and 1B, the liquid jet head 1 includes an ejecting portion 3 for ejecting liquid in an x direction, a circuit board 4 for supplying a drive signal for driving the ejecting portion 3, and a first flexible printed circuit board 5a and a second flexible printed circuit board 5b for electrically connecting the ejecting portion 3 and the circuit board 4. The ejecting portion 3 has a stacked structure in which a first head chip 2a and a second head chip 2b are stacked. The first flexible printed circuit board 5a electrically connects the circuit board 4 and the first head chip 2a, while the second flexible printed circuit board 5b electrically connects the circuit board 4 and the second head chip 2b.

In other words, the circuit board 4 supplies a drive signal via the first and second flexible printed circuit boards 5a and 5b to the first and second head chips 2a and 2b, respectively. The circuit board 4 and the first and second flexible printed circuit boards 5a and 5b are V-shaped or Y-shaped when seen in plan view from a direction perpendicular to the first and second flexible printed circuit boards 5a and 5b (in a z direction). The circuit board 4 has opposed surfaces, and the first and second flexible printed circuit boards 5a and 5b are arranged so as not to overlap each other on one surface S of the opposed surfaces of the circuit board 4. Note that, wiring of the second flexible printed circuit board 5b is routed from one surface (lower surface) to the other surface (upper surface) of the second flexible printed circuit board 5b via a through electrode.

As described above, the first flexible printed circuit board 5a and the second flexible printed circuit board 5b are electrically connected on the one surface S of the circuit board 4, and thus, the thickness of a region occupied by the circuit board 4 and the first and second flexible printed circuit boards 5a and 5b (thickness in the direction of the normal to the surface of the circuit board 4 (z direction)) may be reduced. Further, the number of parts is reduced, and thus, the weight of the liquid jet head 1 may be reduced. Still further, the number of assembly steps is reduced, and thus, the manufacturing cost may be reduced.

The structure of the liquid jet head 1 is specifically described. The circuit board 4 includes a connector 14 for external device connection for inputting a control signal from an external circuit at an end of the one surface S (end in an −x direction) and a first driver IC 13a and a second driver IC 13b at the center of the one surface S. The connector 14 for external device connection and the first and second driver ICs 13a and 13b are electrically connected to each other via wiring (not shown) and electronic components (not shown). The circuit board 4 further includes a first electrode terminal portion 7a and a second electrode terminal portion 7b at an end of the one surface S on the ejecting portion 3 side (end in an +x direction). The first and second electrode terminal portions 7a and 7b are arranged in a line along a longitudinal direction (y direction) on the one surface S of the circuit board 4. The first electrode terminal portion 7a and the first driver IC 13a are electrically connected to each other by wiring (not shown), while the second electrode terminal portion 7b and the second driver IC 13b are electrically connected to each other by wiring (not shown). The first and second driver ICs 13a and 13b generate drive signals for driving the first and second head chips 2a and 2b, respectively. Each of the first and second electrode terminal portions 7a and 7b typically includes 100 or more electrode terminals.

The ejecting portion 3 has a structure in which the first head chip 2a and the second head chip 2b are stacked. Each of the first and second head chips 2a and 2b have opposed front and back surfaces and are stacked back-to-back with the front surfaces facing outwardly in opposite directions (the up and down directions in FIG. 1A). Each of the head chips 2d and 2b includes a piezoelectric substrate PP having many grooves formed in a surface thereof, and a cover plate CP which covers openings of the many grooves and is bonded to the piezoelectric substrate PP to form many channels (not shown). The first head chip 2a and the second head chip 2b are bonded back-to-back under a state in which back surfaces of the piezoelectric substrates PP thereof face each other. The piezoelectric substrate PP protrudes from the cover plate CP in the direction (−x direction) opposite to the liquid ejection direction (x direction), and an electrode extracting portion is formed on a front surface of the protruding portion. Specifically, a first electrode extracting portion 6a is formed on the upper front surface of the piezoelectric substrate PP of the first head chip 2a, while a second electrode extracting portion 6b is formed on the lower front surface of the piezoelectric substrate PP of the second head chip 2b. Therefore, the first and second electrode extracting portions 6a and 6b are arranged so that the first electrode extracting portion 6a is overlaid on the second electrode extracting portion 6b in the stack direction of the first and second head chips 2a and 2b (z direction).

As illustrated in FIG. 1B, the first and second electrode extracting portions 6a and 6b of the first and second head chips 2a and 2b are moved in a direction of an arrow so as to overlap ends of the first and second flexible printed circuit boards 5a and 5b on the +x side and are electrically connected thereto. Further, ends of the first and second flexible printed circuit boards 5a and 5b on the −x side are moved in a direction of arrows so as to overlap the first and second electrode terminal portions 7a and 7b of the circuit board 4 and are electrically connected thereto. Specifically, the first flexible printed circuit board 5a electrically connects the first electrode terminal portion 7a and the first electrode extracting portion 6a, while the second flexible printed circuit board 5b electrically connects the second electrode terminal portion 7b and the second electrode extracting portion 6b. By arranging the first and second electrode terminal portions 7a and 7b in a line along the longitudinal direction thereof in this way, the first flexible printed circuit board 5a and the second flexible printed circuit board 5b do not overlap when seen from the direction of the normal to the one surface S of the circuit board 4. Therefore, the first and second flexible printed circuit boards 5a and 5b may be simultaneously connected by pressure bonding to the first and second electrode terminal portions 7a and 7b, respectively.

As described above, the first and second flexible printed circuit boards 5a and 5b have the function of changing the arrangement of the electrodes in which one electrode is overlaid on the other in the stack direction (thickness direction) to the arrangement on a plane orthogonal to the stack direction. This enables the circuit board 4 and the first and second flexible printed circuit boards 5a and 5b to be formed thin in the stack direction (z direction).

Note that, in the liquid jet head 1 according to the present invention, it is not essential to locate the driver ICs 13a and 13b and the connector 14 for external device connection on the one surface S of the circuit board 4. It may also be possible to generate a drive signal at an external circuit and supply the drive signal via the first and second electrode terminal portions 7a and 7b formed on the circuit board 4 to the first and second flexible printed circuit boards 5a and 5b.

Further, in the first embodiment, the first and second electrode terminal portions 7a and 7b are arranged in a line along the longitudinal direction thereof, but the present invention is not limited thereto. For example, the first and second electrode terminal portions 7a and 7b may be located on the one surface S of the circuit board 4 in parallel with each other in the −x direction under the state in which the longitudinal direction thereof is the y direction. By connecting the first and second flexible printed circuit boards 5a and 5b to the first and second electrode terminal portions 7a and 7b, respectively, so as to overlap on the one surface S, the effect of the present invention may also be obtained. However, the first and second flexible printed circuit boards 5a and 5b cannot be simultaneously connected by pressure bonding to the first and second electrode terminal portions 7a and 7b, respectively. Further, routing of wirings between the first and second driver ICs 13a and 13b and the first and second electrode terminal portions 7a and 7b, respectively, becomes complicated. Therefore, by arranging the first and second electrode terminal portions 7a and 7b in a line as in the first embodiment, design and manufacture become easier.

Further, in the first embodiment, a case in which two head chips are stacked in the ejecting portion 3 is described, but the present invention is not limited thereto, and a case in which three or more head chips are included and three or more flexible printed circuit boards are used is also within the scope of the present invention. For example, three or more head chips are stacked to form the ejecting portion 3 and the head chips are connected via flexible printed circuit boards, respectively, to the circuit board. In this case, each of the flexible printed circuit boards is electrically connected to one surface of the circuit board. For example, three or more electrode terminal portions are arranged in a line along the longitudinal direction thereof on the surface, and the electrode extracting portions of the head chips and the electrode terminal portions of the circuit board are connected via the flexible printed circuit boards, respectively. This enables the region occupied by the circuit board and the flexible printed circuit boards to be significantly thinned. Further, the number of assembly steps is significantly reduced, and thus, the manufacturing cost may be significantly reduced.

(Second Embodiment)

Figure 2:
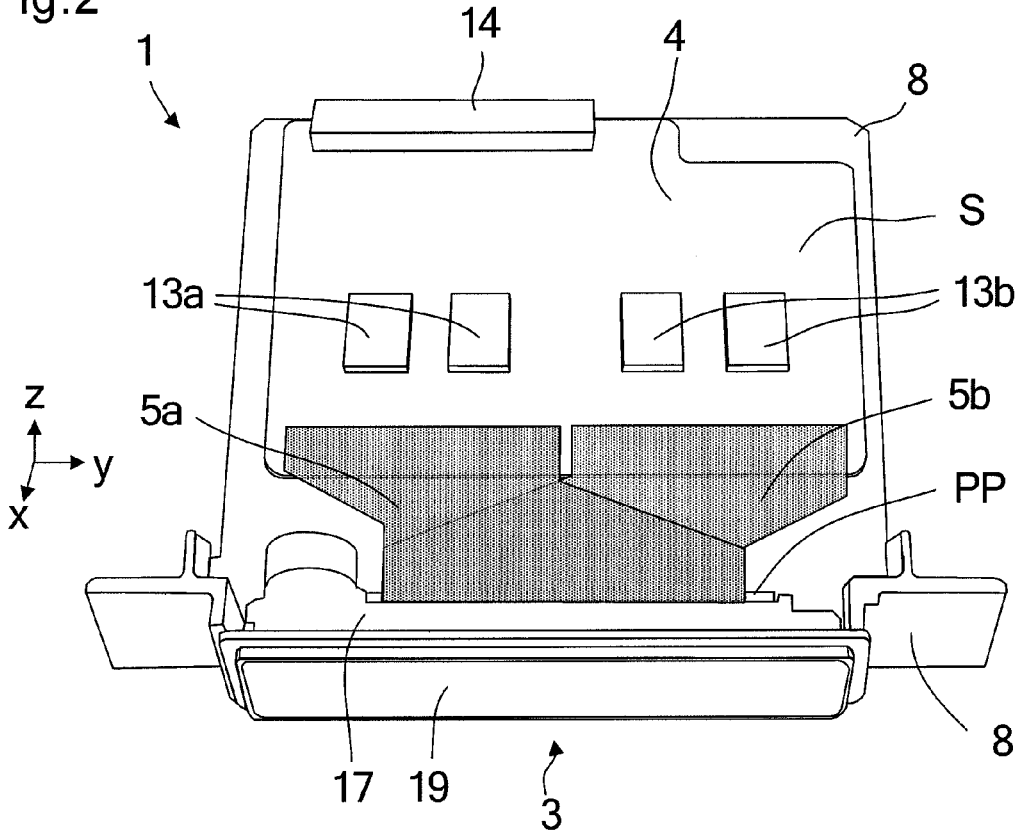
FIG. 2 is a perspective view of a liquid jet head according to a second embodiment of the present invention.
Figure 3:
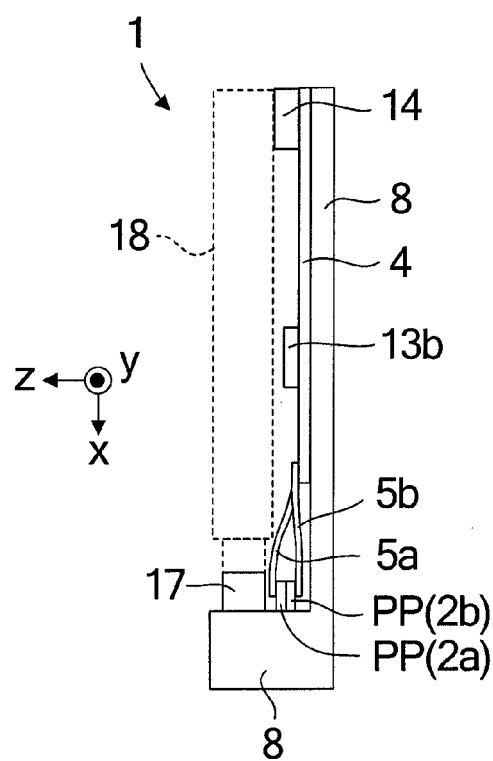
FIG. 3 is a schematic side view of the liquid jet head according to the second embodiment of the present invention.
Figure 4:
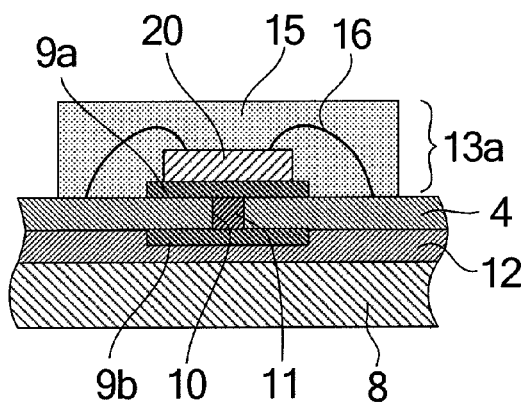
FIG. 4 is a schematic vertical sectional view of a driver IC of the liquid jet head according to the second embodiment of the present invention.

FIGS. 2 to 4 illustrate a liquid jet head 1 according to a second embodiment of the present invention. FIG. 2 is a perspective view of the liquid jet head 1 when seen from the side of an ejection surface 19 from which liquid is ejected. FIG. 3 is a schematic side view of the liquid jet head 1. FIG. 4 is a schematic vertical sectional view of the driver ICs 13. The structures of the ejecting portion 3, the first and second flexible printed circuit boards 5a and 5b, and the circuit board 4 are similar to those in the first embodiment. Like reference symbols are used to designate like members or members having like functions.

As illustrated in FIGS. 2 and 3, the liquid jet head 1 includes the ejecting portion 3 in which the first and second head chips 2a and 2b for ejecting liquid are stacked, the circuit board 4 for supplying a drive signal for driving the ejecting portion 3, the first and second flexible printed circuit boards 5a and 5b for electrically connecting the first and second head chips 2a and 2b and the circuit board 4, and a base substrate 8 for fixing the ejecting portion 3 and the circuit board 4. The ejecting portion 3 is fixed to a lower portion of the base substrate 8, while the circuit board 4 is fixed to a partition-like plate surface of the base substrate 8. Note that, the x direction is the direction of gravity.

Each of the first and second head chips 2a and 2b which form the ejecting portion 3 has a structure in which the piezoelectric substrate PP and the cover plate CP are stacked. A flow path member 17 for guiding liquid to many channels is located on surfaces of the cover plates CP. The lowest surface of the ejecting portion 3 is the ejection surface 19 for ejecting liquid.

The circuit board 4 includes the connector 14 for external device connection at an upper end of the one surface S thereof (end in the −x direction) for connection to an external circuit, the first and second driver ICs 13a and 13b substantially at the center of the one surface S for generating a drive signal, and the first and second electrode terminal portions 7a and 7b (not shown) at a lower end of the one surface S (end in the +x direction), which are arranged in a line along the longitudinal direction thereof.

The first flexible printed circuit board 5a electrically connects the first electrode terminal portion 7a (not shown) and the first electrode extracting portion 6a (not shown), while the second flexible printed circuit board 5b electrically connects the second electrode terminal portion 7b (not shown) and the second electrode extracting portion 6b (not shown). The first flexible printed circuit board 5a and the second flexible printed circuit board 5b overlap so as to be V-shaped or Y-shaped when seen in plan view, and do not overlap each other above the one surface S of the circuit board 4. Therefore, the thickness of the first and second head chips 2a and 2b in the stack direction (z direction) may be reduced. As illustrated in FIG. 3, for example, a pressure buffer 18 may be provided so as to be upright and in parallel with the circuit board 4. Further, instead of the pressure buffer 18, a filter unit, a flow path member, or the like may be located. Further, the number of parts is reduced, and thus, the weight of the liquid jet head 1 may be reduced. Still further, the number of assembly steps is reduced, and thus, the manufacturing cost may be reduced.

As illustrated in FIG. 4, the first driver IC 13a is mounted on the circuit board 4. The first driver IC 13a includes a first metal film 9a formed on the circuit board 4, an IC chip 20 adhered onto the first metal film 9a via a conductive paste (not shown), wires 16 for electrically connecting electrodes (not shown) of the IC chip 20 and electrodes (not shown) on the circuit board 4, and a mold material 15 for protection against pollution and the like. The second driver IC 13b has the same structure.

A through hole 10 is formed in the circuit board 4, and the through hole 10 is filled with a metal material 11. A second metal film 9b is located on a rear surface side of the circuit board 4 which is opposite to the first driver IC 13a side. Further, space between the second metal film 9b and the base substrate 8 is filled with a thermally conductive paste 12. This structure causes heat generated in the first driver IC 13a to be dissipated via the first metal film 9a, the metal material 11, the second metal film 9b, and the thermally conductive paste 12 to the base substrate 8. By using a thermally conductive material such as aluminum as the base substrate 8 to function as a heat sink plate, lowering of the function due to temperature rise of the driver IC 13a may be prevented.

As described above, the second embodiment has a structure in which the first driver IC 13a and the second driver IC 13b are mounted on the one surface S of the circuit board 4 and the first and second driver ICs 13a and 13b are thermally in contact with the same partition-like plate surface of the base substrate 8 to dissipate heat. As a result, the need for using a plurality of heat sink plates is eliminated, and the thickness of the region occupied by the circuit board 4 and the heat dissipating portion of the base substrate 8 (thickness in the direction of the normal to the surface of the circuit board) may be reduced. Therefore, combined with the formation of the region occupied by the first and second flexible printed circuit boards 5a and 5b so as to be thin, the region of the ejecting portion 3 opposite to the liquid ejection side may be formed so as to be significantly thin. Further, the need for using a plurality of heat sink plates is eliminated, and thus, the weight of the liquid jet head 1 may be further reduced. In addition, the number of assembly steps is reduced, and thus, the manufacturing cost may be reduced.

(Third Embodiment)

Figure 5:
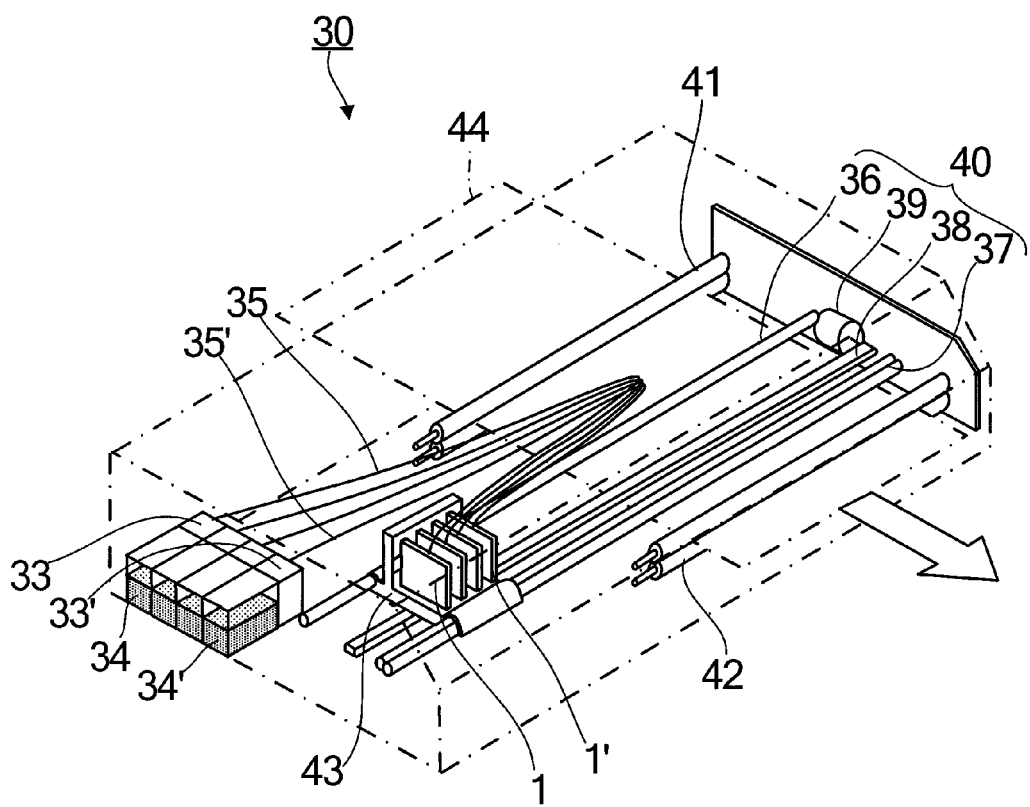
FIG. 5 is a schematic perspective view of a liquid jet apparatus according to a third embodiment of the present invention.
Figure 6:
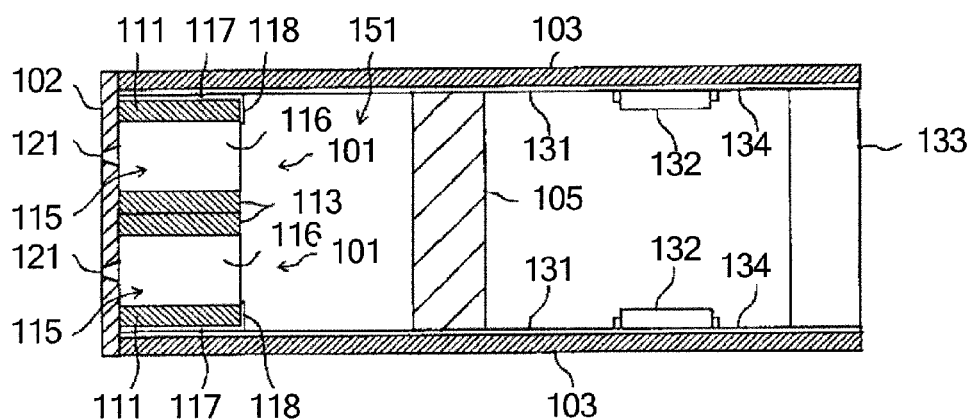
FIG. 6 is a transverse sectional view of a conventionally known ink jet head in which two head chips are stacked.
Figure 7:
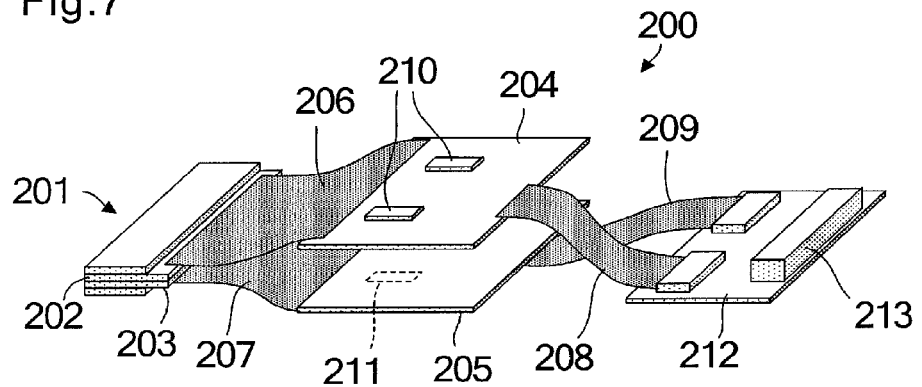
FIG. 7 is a schematic perspective view illustrating another conventionally known liquid jet head.

FIG. 5 is a schematic perspective view of a liquid jet apparatus 30 according to a third embodiment of the present invention. The liquid jet apparatus 30 includes a moving mechanism 40 for reciprocating liquid jet heads 1 and 1', flow path portions 35 and 35' for supplying liquid to the liquid jet heads 1 and 1', respectively, and liquid pumps 33 and 33' and liquid tanks 34 and 34' for supplying liquid to the flow path portions 35 and 35', respectively. The liquid jet heads 1 and 1' each include a plurality of ejection grooves, and a liquid droplet is ejected from a nozzle communicating with each of the ejection grooves. As the respective liquid jet heads 1 and 1', the liquid jet heads described in the first or second embodiment are used.

The liquid jet apparatus 30 includes a pair of transport means 41 and 42 for transporting a recording medium 44 such as paper in a main scanning direction, the liquid jet heads 1 and 1' for ejecting liquid onto the recording medium 44, a carriage unit 43 for mounting the liquid jet heads 1 and 1' thereon, the liquid pumps 33 and 33' for pressing liquid stored in the liquid tanks 34 and 34' to supply the liquid to the flow path portions 35 and 35', respectively, and the moving mechanism 40 for causing the liquid jet heads 1 and 1' to perform scanning in a sub-scanning direction orthogonal to the main scanning direction. A control portion (not shown) controls and drives the liquid jet heads 1 and 1', the moving mechanism 40, and the transport means 41 and 42.

The pair of transport means 41 and 42 each extend in the sub-scanning direction, and include a grid roller and a pinch roller which rotate with their roller surfaces being in contact with each other. The grid roller and the pinch roller are rotated about their shafts by means of a motor (not shown) to transport the recording medium 44 sandwiched between the rollers in the main scanning direction. The moving mechanism 40 includes a pair of guide rails 36 and 37 extending in the sub-scanning direction, the carriage unit 43 capable of sliding along the pair of guide rails 36 and 37, an endless belt 38 to which the carriage unit 43 is connected for moving the carriage unit 43 in the sub-scanning direction, and a motor 39 for rotating the endless belt 38 through pulleys (not shown).

The carriage unit 43 has the plurality of liquid jet heads 1 and 1' mounted thereon for ejecting liquid droplets of four types, for example, yellow, magenta, cyan, and black. The liquid tanks 34 and 34' store liquid of corresponding colors, and supply the liquid via the liquid pumps 33 and 33' and the flow path portions 35 and 35' to the liquid jet heads 1 and 1', respectively. The liquid jet heads 1 and 1' each eject a liquid droplet of each color according to a drive signal. By controlling the timing to eject the liquid from the liquid jet heads 1 and 1', the rotation of the motor 39 for driving the carriage unit 43, and the transport speed of the recording medium 44, an arbitrary pattern may be recorded onto the recording medium 44.

According to the liquid jet apparatus 30 of the present invention, the number of parts of the liquid jet head 1 is reduced and the weight is reduced, and thus, the weight of the carriage unit 43 is reduced, and the load on a drive system for driving the carriage unit 43 is reduced.

What is claimed is:

1. A liquid jet head, comprising:
   an ejecting portion for ejecting liquid, the ejecting portion comprising first and second head chips each having opposed front and back surfaces and being stacked back-to-back with the front surfaces facing outwardly in opposite directions;
   a circuit board for supplying a drive signal for driving the ejecting portion, the circuit board having opposed surfaces;
   a first flexible printed circuit board that electrically connects the front surface of the first head chip and one of the opposed surfaces of the circuit board; and
   a second flexible printed circuit board that electrically connects the front surface of the second head chip and the one surface of the circuit board.

2. A liquid jet head according to claim 1, wherein the first flexible printed circuit board and the second flexible printed circuit board overlap so as to have one of a V-shape and a Y-shape when seen in plan view.

3. A liquid jet head according to claim 2, wherein the first flexible printed circuit board and the second flexible printed circuit board do not overlap each other on the circuit board when seen from a direction normal to the one surface of the circuit board.

4. A liquid jet head according to claim 2, wherein:
   the first head chip comprises a first electrode extracting portion;
   the second head chip comprises a second electrode extracting portion; and
   the first electrode extracting portion and the second electrode extracting portion are arranged so that the first electrode extracting portion and the second electrode extracting portion overlap each other in a direction in which the first head chip and the second head chip are stacked.

5. A liquid jet head according to claim 4, wherein:
   the circuit board comprises a first electrode terminal portion and a second electrode terminal portion; and
   the first electrode terminal portion and the second electrode terminal portion are arranged in a line along a longitudinal direction of the first electrode terminal portion and a longitudinal direction of the second electrode terminal portion on the one surface of the circuit board.

6. A liquid jet head according to claim 5, wherein:
   the first flexible printed circuit board electrically connects the first electrode extracting portion and the first electrode terminal portion to each other; and
   the second flexible printed circuit board electrically connects the second electrode extracting portion and the second electrode terminal portion to each other.

7. A liquid jet head according to claim 2, further comprising a base substrate for fixing the ejecting portion and the circuit board, wherein:
   the circuit board comprises a driver IC mounted on the one surface of the circuit board; and
   the liquid jet head further comprises a thermally conductive material interposed between the base substrate and the other of the opposed surfaces of the circuit board corresponding to a region on the one surface of the circuit board in which the driver IC is mounted.

8. A liquid jet head according to claim 7, wherein:
   the driver IC is located on a first metal film formed on the one surface of the circuit board;
   the other surface of the circuit board corresponding to a region on the one surface of the circuit board in which the first metal film is located has a second metal film formed thereon; and
   the first metal film and the second metal film are connected to each other via a metal material filled in a through hole formed in the circuit board.

9. A liquid jet apparatus, comprising:
   the liquid jet head according to claim 2;
   a moving mechanism for reciprocating the liquid jet head;
   a liquid supply tube for supplying liquid to the liquid jet head; and
   a liquid tank for supplying the liquid to the liquid supply tube.

10. A liquid jet head according to claim 1, wherein the first flexible printed circuit board and the second flexible printed circuit board do not overlap each other on the circuit board when seen from a direction normal to the one surface of the circuit board.

11. A liquid jet head according to claim 1, wherein:
the first head chip comprises a first electrode extracting portion;
the second head chip comprises a second electrode extracting portion; and
the first electrode extracting portion and the second electrode extracting portion are arranged so that the first electrode extracting portion and the second electrode extracting portion overlap each other in a direction in which the first head chip and the second head chip are stacked.

12. A liquid jet head according to claim 11, wherein:
the circuit board comprises a first electrode terminal portion and a second electrode terminal portion; and
the first electrode terminal portion and the second electrode terminal portion are arranged in a line along a longitudinal direction of the first electrode terminal portion and a longitudinal direction of the second electrode terminal portion on the one surface of the circuit board.

13. A liquid jet head according to claim 12, wherein:
the first flexible printed circuit board electrically connects the first electrode extracting portion and the first electrode terminal portion to each other; and
the second flexible printed circuit board electrically connects the second electrode extracting portion and the second electrode terminal portion to each other.

14. A liquid jet head according to claim 1, further comprising a base substrate for fixing the ejecting portion and the circuit board, wherein:
the circuit board comprises a driver IC mounted on the one surface of the circuit board; and
the liquid jet head further comprises a thermally conductive material interposed between the base substrate and the other of the opposed surfaces of the circuit board corresponding to a region on the one surface of the circuit board in which the driver IC is mounted.

15. A liquid jet head according to claim 14, wherein:
the driver IC is located on a first metal film formed on the one surface of the circuit board;
the another surface of the circuit board corresponding to a region on the one surface of the circuit board in which the first metal film is located has a second metal film formed thereon; and
the first metal film and the second metal film are connected to each other via a metal material filled in a through hole formed in the circuit board.

16. A liquid jet apparatus, comprising:
the liquid jet head according to claim 1;
a moving mechanism for reciprocating the liquid jet head;
a liquid supply tube for supplying liquid to the liquid jet head; and
a liquid tank for supplying the liquid to the liquid supply tube.

17. A liquid jet head according to claim 1, wherein the first and second flexible printed circuit boards have wiring that electrically connects the front surfaces of the first and second head chips to the one surface of the circuit board, the wiring of the second flexible printed circuit board being routed from one surface of the second flexible printed circuit board to another surface thereof via a through electrode.

* * * * *